United States Patent

Watanabe et al.

[11] Patent Number: 5,966,589
[45] Date of Patent: Oct. 12, 1999

[54] METHOD OF FABRICATING THIN FILM TRANSISTOR ARRAY

[75] Inventors: Takahiko Watanabe; Osamu Sukegawa, both of Tokyo, Japan

[73] Assignee: NEC Corporation, Japan

[21] Appl. No.: 08/989,573

[22] Filed: Dec. 12, 1997

[30] Foreign Application Priority Data

Dec. 18, 1996 [JP] Japan ................................. 8-338375

[51] Int. Cl.⁶ .......................... M01L 21/00; M01L 21/84
[52] U.S. Cl. ............................ 438/30; 438/158; 438/159
[58] Field of Search ............................. 438/30, 158, 159

[56] References Cited

U.S. PATENT DOCUMENTS

| | | | |
|---|---|---|---|
| 5,811,318 | 9/1998 | Kweon | 438/30 |
| 5,830,785 | 11/1998 | Sanson et al. | 438/158 |
| 5,867,233 | 2/1999 | Tanaka | 349/43 |
| 5,872,021 | 2/1999 | Matsumoto et al. | 438/30 |
| 5,879,958 | 3/1999 | Kawahata et al. | 438/30 |
| 5,888,855 | 3/1999 | Nagashisa et al. | 438/158 |

FOREIGN PATENT DOCUMENTS

| | | |
|---|---|---|
| 62-298117 | 12/1987 | Japan . |
| 62-298118 | 12/1987 | Japan . |
| 5-243333 | 9/1993 | Japan . |
| 6-102528 | 4/1994 | Japan . |

*Primary Examiner*—John F. Niebling
*Assistant Examiner*—Michael S. Lebentritt
*Attorney, Agent, or Firm*—Ostrolenk, Faber, Gerb & Soffen, LLP

[57] ABSTRACT

There is provided a method of fabricating a thin film transistor array having a transparent insulating substrate, a plurality of thin film transistors formed on the substrate in a matrix, a gate bus line connected to gate electrodes of the thin film transistors, a drain bus line connected to drain electrodes of the thin film transistors, and a pixel electrode driven by the thin film transistors, the method including the steps of forming the gate electrode and the gate bus line on the transparent insulating substrate, forming a gate insulating film over the substrate, forming an operative semiconductor on the gate insulating film, forming the source electrodes, drain electrodes, and drain bus line of the thin film transistors on the gate insulating film and the operative semiconductor, forming a protection film all over the substrate, removing a portion of both the gate insulating film and the protection film, located above a terminal of the gate bus line, and also removing a portion of the protection film located above a terminal of the drain bus line, and forming the pixel electrode on the substrate. The above-mentioned method makes it possible to make a gate bus line and a drain bus line appear by only one photolithography step. Hence, the above-mentioned method needs to carry out only five photolithography steps to fabricate a thin film transistor array, whereas the conventional methods have to carry out six photolithography steps.

11 Claims, 15 Drawing Sheets

METHOD OF FABRICATING THIN FILM TRANSISTOR ARRAY

BACKGROUND OF THE INVENTION

1. Field of the Invention

The invention relates to a method of fabricating a thin film transistor array.

2. Description of the Related Art

One of conventional methods of fabricating a thin film transistor (hereinafter, "thin film transistor" is referred to simply as "TFT") array to be used for a liquid crystal display (LCD) has been suggested in Japanese Unexamined Patent Publication No. 5-243333. The suggested method is explained hereinbelow with reference to FIGS. 1, 2, 3A and 3B.

As illustrated in FIG. 2, a gate electrode 31 and a gate bus line 32 connecting to the gate electrode 31 are first formed on a transparent, insulating substrate 30. The gate electrode 31 and the gate bus line 32 are made of metal such as chromium. Then, as illustrated in FIG. 3B, operative semiconductor films 35 are successively formed, and as a result, operative semiconductor islands are formed on the gate electrode 31. Each of the operative semiconductor films 35 is constituted of a multi-layered gate insulating film 33 including layers made of insulators such as silicon dioxide and silicon nitride, and an amorphous silicon film 34.

Then, there are formed contact holes 38 throughout the gate insulating film 33 for electrically connecting a lower metal layer 36 to an upper metal layer 37. Then, there are formed the upper metal layer 37, a signal line 39, a source electrode 40 and a drain electrode 41. For instance, they are made of chromium.

Then a transparent electrode 42 and a pixel electrode 43 made of indium tin oxide (ITO) are formed at a terminal section. Subsequently, phosphorus-doped amorphous silicon between the source electrode 40 and the drain electrode 41 is removed. Thus, there is completed TFT.

Then, a protection film made of silicon nitride is deposited all over the substrate, followed by removal of portions of the protection film located above a gate terminal, a drain terminal, and the pixel electrode. Thus, a TFT array substrate is completed.

For the purpose of shortening photolithography steps, in particular, of removing a portion of an insulating film at a terminal, various methods have been suggested in Japanese Unexamined Patent Publications 62-298117, 62-298118 and 6-102528.

The above-mentioned Japanese Unexamined Patent Publication 62-298117 has suggested a method where a film for protecting TFT is formed without removing a photoresist film having been formed when an upper metal layer was formed, and a photolithography step for removing the protection film by lift-off is omitted.

The above-mentioned Japanese Unexamined Patent Publication 62-298118 has suggested a method where one photo-mask can be omitted by leaving a metal film not removed on ends of a gate bus line, a drain bus line, and an auxiliary capacitive bus line, and exposing a substrate to a light from its rear with a negative type photoresist being deposited on the substrate.

The above-mentioned Japanese Unexamined Patent Publication 6-102528 has suggested two methods. One of them provides an advantage of omitting one photolithography step by the steps of forming a protection film over a substrate after formation of an upper metal film, forming a transparent electrode without removing a photoresist film used for forming holes throughout a gate bus line end, an auxiliary capacitive bus line end, and a drain bus line, and then forming a pixel electrode and an electrode covering a terminal by lift-off.

The other provides an advantage of omitting one photolithography step for forming a contact hole electrically connecting an upper metal layer to a lower metal layer, by the steps of forming a polyimide film with ends of a gate bus line and an auxiliary capacitive bus line, forming a gate insulating film and an operative semiconductor film, forming a drain electrode, a pixel electrode, and a protection film, forming a photoresist film having a pattern by which holes are formed at ends of a drain bus line, a gate bus line, and an auxiliary bus line, etching the end of the drain bus line with both a transparent electrode located above the drain bus line end and the end of the gate bus line serving as an etching stopper, and etching the end of the auxiliary capacitive bus line with the polyimide film serving as an etching stopper, and removing the polyimide film by dry etching.

However, the conventional methods of fabricating a TFT array substrate such as the method suggested in Japanese Unexamined Patent Publication No. 5-243333 have a problem that two photolithography steps have to be carried out, one of which is for forming a contact hole for electrically connecting upper and lower metal layers with each other, and the other is for removing a protection film located above an end of a bus line.

In accordance with the methods having been suggested in Japanese Unexamined Patent Publications Nos. 62-298117 and 6-102528, a gate insulating film is not formed at an end of a bus line. Though the methods are useful for fabricating a single kind of TFT array substrate, but not suitable to fabrication of a plurality of kinds of TFT array substrates, because a region where a gate insulating film is to be formed has to be changed for each of kinds of TFT array substrates.

In addition, since the methods having been suggested in Japanese Unexamined Patent Publications Nos. 62-298117 and 6-102528 employs the lift-off process by which, when a photoresist film is removed, a film formed on the photoresist film is also removed together with the photoresist film, there generates debris when the film and the photoresist film are removed, resulting in that a fabrication yield is lowered.

The conventional method having been suggested in Japanese Unexamined Patent Publication No. 6-102528 additionally has a step of forming a polyimide film at an end of a bus line of a lower metal layer, and as a result, has an extra photolithography step.

The conventional method having been suggested in Japanese Unexamined Patent Publication No. 62-298118 makes it possible to reduce a photo-mask using step, but fabrication steps of the method remains the same as prior methods, resulting in that a fabrication cost would not be reduced.

SUMMARY OF THE INVENTION

In view of the foregoing problems of the conventional methods, it is an object of the present invention to provide a method of fabricating a thin film transistor array on a substrate with a higher fabrication efficiency, in particular, with reduction in the number of photolithography steps.

There is provided a method of fabricating a thin film transistor array including a transparent insulating substrate, a plurality of thin film transistors formed on the substrate in a matrix, a gate bus line connected to gate electrodes of the thin film transistors, a drain bus line connected to drain electrodes of the thin film transistors, and a pixel electrode driven by the thin film transistors, the method including the steps of (a) forming the gate electrode and the gate bus line on the transparent insulating substrate, (b) forming a gate insulating film over the substrate, (c) forming an operative semiconductor on the gate insulating film, (d) forming the source electrodes, drain electrodes, and drain bus line of the thin film transistors on the gate insulating film and the operative semiconductor, (e) forming a protection film all over the substrate, (f) removing a portion of both the gate insulating film and the protection film, located above a terminal of the gate bus line, and removing a portion of the protection film located above a terminal of the drain bus line, and (g) forming the pixel electrode on the substrate.

The thin film transistor array may further include an auxiliary capacitive bus line formed on the substrate in facing relation to the pixel electrode with the gate insulating film therebetween, in which case it is preferable that a portion of both the gate insulating film and the protection film, located above a terminal of the auxiliary capacitive bus line, is also removed in the step (f).

There is further provided a method of fabricating a thin film transistor array including a transparent insulating substrate, a plurality of thin film transistors formed on the substrate in a matrix, a gate bus line connected to gate electrodes of the thin film transistors, a drain bus line connected to drain electrodes of the thin film transistors, an auxiliary capacitive bus line, and a pixel electrode driven by the thin film transistors, the thin film transistor array controlling liquid crystal by a horizontal field produced between the pixel electrode and the auxiliary capacitive bus line, the method including the steps of (a) forming the gate electrode, the gate bus line, and the auxiliary bus line all on the transparent insulating substrate, and a first transparent electrode on the gate electrode and the auxiliary capacitive bus line, (b) forming a gate insulating film over the substrate, (c) forming an operative semiconductor on the gate insulating film, (d) forming (d-1) the drain electrodes and the drain bus line of the thin film transistors on the gate insulating film and the operative semiconductor, (d-2) the pixel electrode of the same material as material of which the drain electrode and the drain bus line are formed, and (d-3) a second transparent electrode on the drain electrode, the drain bus line, and the pixel electrode, (e) forming a protection film all over the substrate, and (f) removing a portion of the protection film located above a terminal of the drain bus line to cause the second transparent electrode to appear, and also removing a portion of the protection film and the gate insulating film both located above a terminal of the auxiliary bus line to cause the first transparent electrode to appear.

It is preferable that a portion of the protection film and the gate insulating film located above a terminal of the gate bus line is also removed in the step (f) to cause the first transparent electrode to appear.

The gate insulating film may be formed to have a multi-layered structure in the step (b). For instance, the operative semiconductor is formed where the gate bus line overlaps the drain bus line. A portion of the protection film located above the drain and source electrodes may be also removed in the step (f). For instance, the pixel electrode may be formed of indium tin oxide (ITO).

In accordance with the above-mentioned methods, it is possible to cause a gate line, a drain line, and an auxiliary capacitive terminal to appear outside by only one photolithography step.

Specifically, the conventional methods need to carry out six photolithography steps for fabricating a TFT array on a substrate. In contrast, the method as defined in claim 1 need to carry out only five photolithography steps, and the method as defined in claim 6 need to carry out only four photolithography steps for doing the same.

Since the method in accordance with the present invention does not employ lift-off unlike the conventional methods, debris caused by lift-off is not generated. In the conventional methods, a fabrication yield is lowered by that a film formation is controlled by a metal mask at a terminal, and that a polyimide film formed on a terminal of an underlying layer in order to use the polyimide film as an etching stopper. In contrast, the method in accordance with the present invention has no factors for reducing a fabrication yield, and further can shorten fabrication steps.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
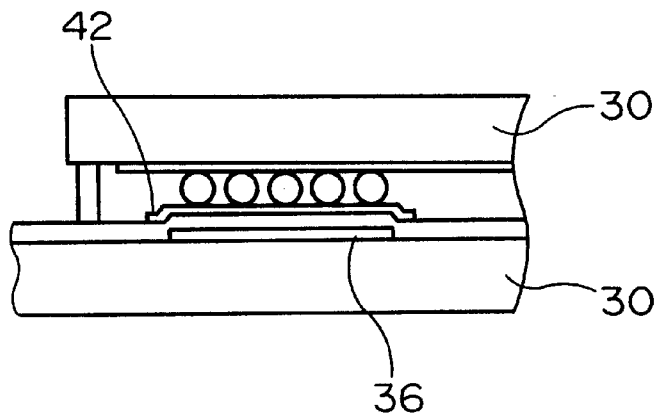
FIG. 1 is a cross-sectional view of a conventional thin film transistor array formed on a substrate.
Figure 2:
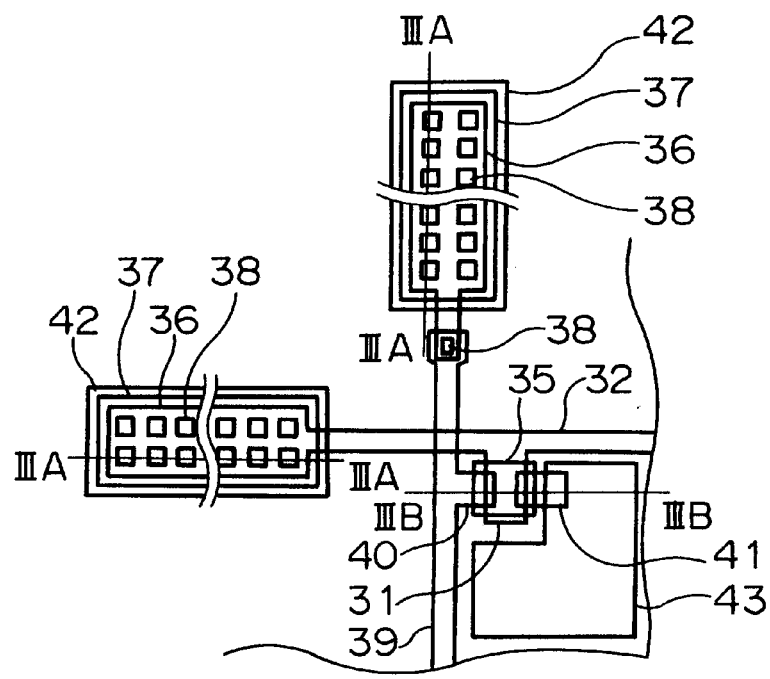
FIG. 2 is a plan view of the thin film transistor array illustrated in FIG. 1.
Figure 3A:
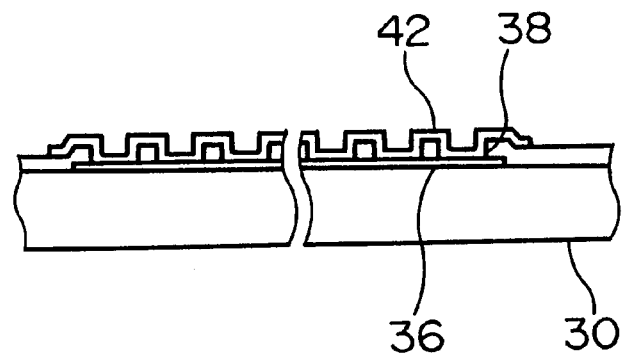
FIG. 3A is a cross-sectional view taken along the line IIIA—IIIA in FIG. 2.
Figure 3B:
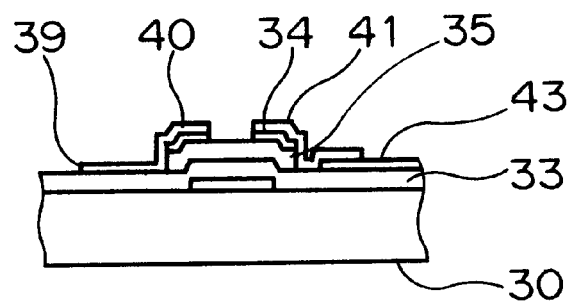
FIG. 3B is a cross-sectional view taken along the line IIIB—IIIB in FIG. 2.
Figure 4:
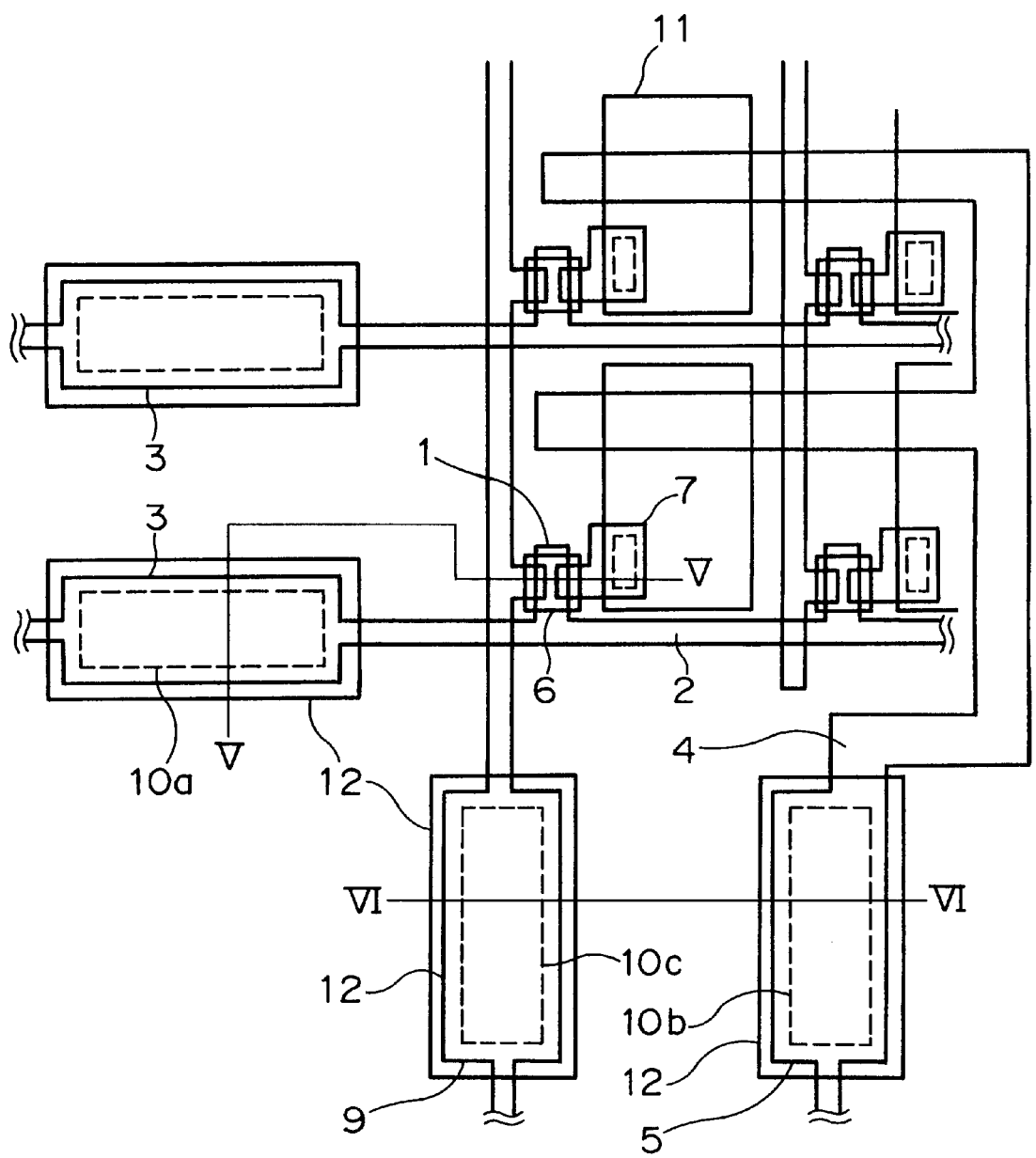
FIG. 4 is plan view illustrating a thin film transistor array in accordance with the first embodiment of the invention.

The first embodiment in accordance with the present invention is explained hereinbelow with reference to FIGS. 4 to 6 and 7A to 7N. FIG. 4 is a plan view illustrating a twisted nematic type TFT, FIG. 5 is a cross-sectional view taken along the line V—V in FIG. 4, illustrating a terminal of a gate bus line and TFT, FIG. 6 is a cross-sectional view taken along the line VI—VI in FIG. 4, and FIGS. 7A to 7N illustrate respective steps of a method of fabricating a TFT array in accordance with the first embodiment.

Figure 5:
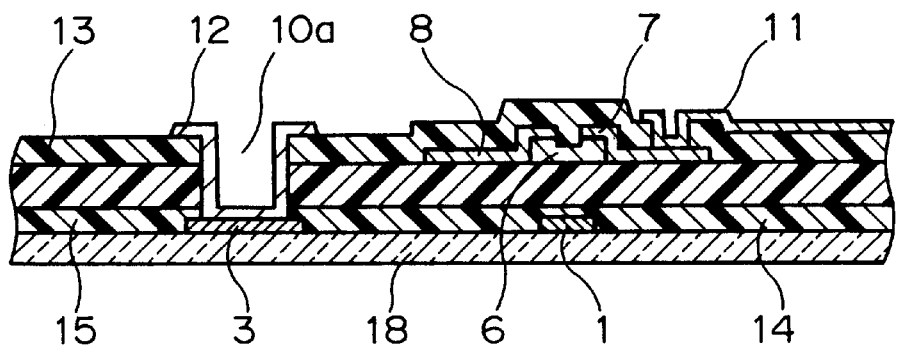
FIG. 5 is a cross-sectional view taken along the line V—V in FIG. 4.

As illustrated in FIGS. 4 and 5, a TFT array in accordance with the first embodiment includes a transparent insulating substrate 18, a plurality of TFTs formed on the substrate 18 in a matrix, a gate bus line 2 connected to gate electrodes of TFTs, a drain bus line 8 connected to drain electrodes of TFTs, and a pixel electrode 11 driven by TFTs.

As illustrated in FIG. 5, each of TFTs is comprised of a gate electrode 1, a gate insulating film 14, a silicon nitride film 15, an operative semiconductor film 6, and source/drain electrodes 7, deposited in this order on the transparent, insulating substrate 18. The TFT array further includes an auxiliary capacitive bus line 4 in facing relation with the pixel electrode 11 with the gate insulatiing film 14 therebetween. The TFTs formed on the substrate 18 are covered with a protection film 13.

Figure 6:
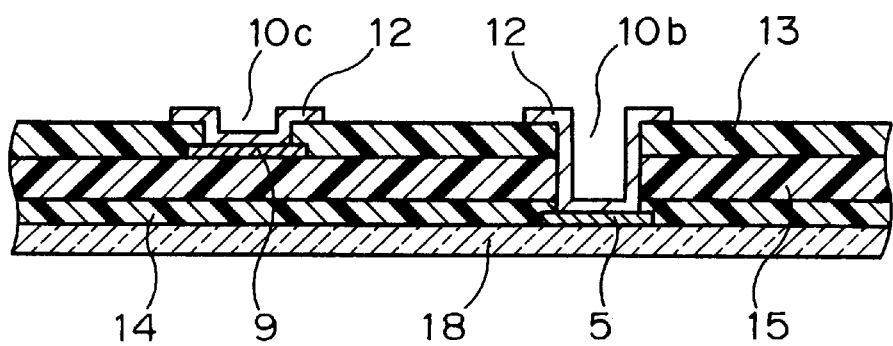
FIG. 6 is a cross-sectional view taken along the line VI—VI in FIG. 4.
Figure 7A:
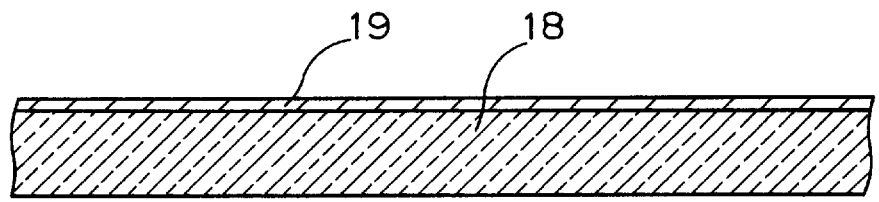
FIGS. 7A to 7N are cross-sectional views of a thin film transistor array formed on a substrate, illustrating respective steps of a method of forming the same in accordance with the first embodiment.

As illustrated in FIGS. 5 and 6, a gate line terminal 3 and an auxiliary capacitive terminal 5 are formed on the substrate 18, above both of which there are formed throughholes 10a and 10b. Transparent electrodes 12 are formed on an inner wall of the through-holes 10a and 10b, and make electrical contact with the gate line terminal 3 and the auxiliary capacitive terminal 5, respectively. A drain line terminal 9 is formed on the silicon nitride film 15. A transparent electrode 12 is formed on an inner wall of a through-hole 10c formed above the drain line terminal 9 through the protection film 13, and makes electrical connection with the drain line terminal 9.

The method of fabricating the TFT array illustrated in FIGS. 4 to 6 is explained hereinbelow with reference to FIGS. 7A to 7N. First, a transparent, insulating substrate 18 such as a glass substrate is washed at a principal surface thereof. Then, as illustrated in FIG. 7A, a lower metal layer 19 is formed on the glass substrate 18 by sputtering. For instance, the lower metal layer 19 is made of Cr, Mo, Al, Ta or Ti.

Figure 7B:
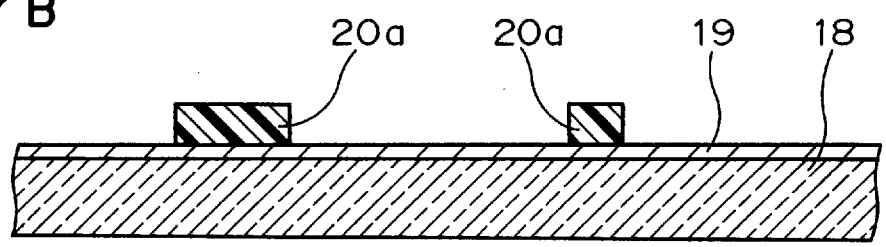

Then, as illustrated in FIG. 7B, a patterned photoresist film 20a which will serve as an etching mask is formed on the lower metal layer 19 by a first photolithography step including application of photoresist onto the lower metal layer 19, exposure of the photoresist to a light, and development of the photoresist.

Figure 7C:
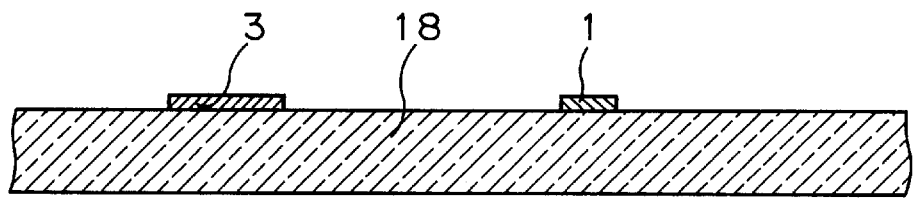

Then, the lower metal layer 19 is wet-etched with the patterned photoresist film 20a serving as a mask. Thereafter, the photoresist film 20a is removed, and then, the glass substrate 18 is washed. Thus, as illustrated in FIG. 7C, there are formed the gate electrode 1 and the gate line terminal 3 of TFT both of which are made from the lower metal layer 19. Though not illustrated in FIG. 7C, the gate bus line 2, the auxiliary bus line 4 and the auxiliary capacitive terminal 5 are also formed on the glass substrate 18.

Figure 7D:
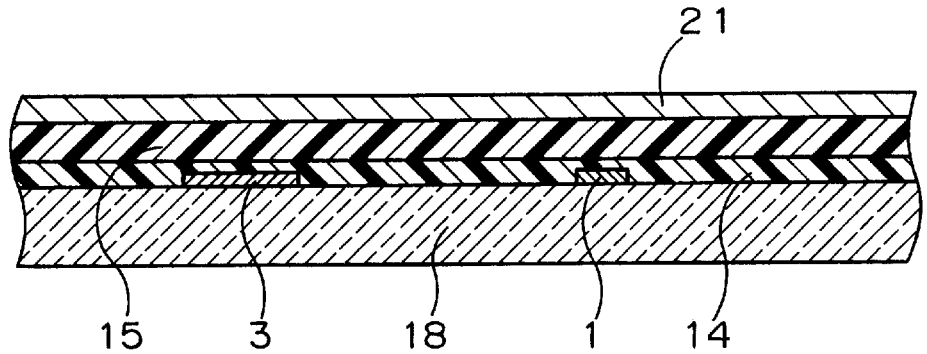

Then, as illustrated in FIG. 7D, the silicon dioxide film 14 are deposited entirely over the glass substrate 18 by sputtering, and then, the silicon nitride film 15 and an amorphous silicon (a-Si+n$^+$a-Si) film 21 are successively formed on the silicon dioxide film 14 by plasma-enhanced chemical vapor deposition (CVD).

Figure 7E:
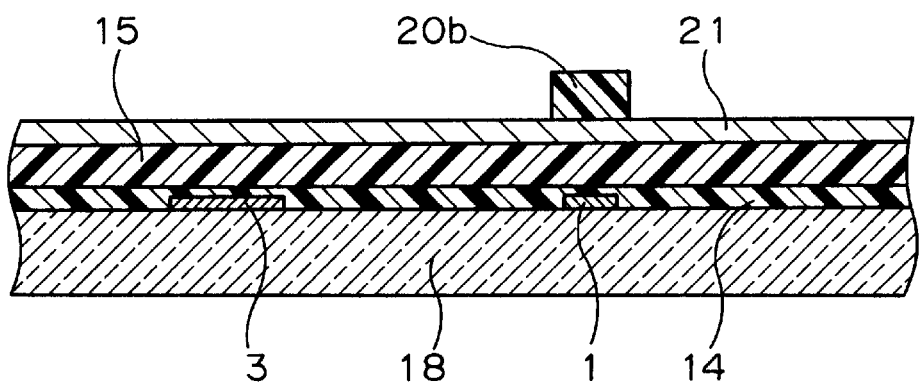

Then, as illustrated in FIG. 7E, there is formed a patterned photoresist film 20b on the amorphous silicon film 21 by a second photolithography step. The patterned photoresist film 20b serves as a mask used for forming an operative device of TFT.

Figure 7F:
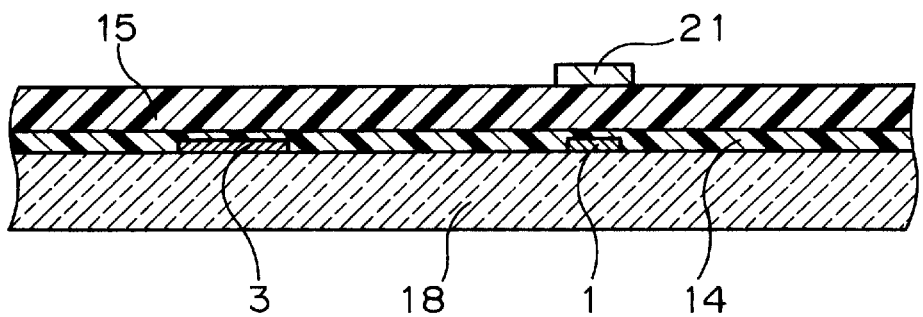

Then, as illustrated in FIG. 7F, the amorphous silicon film 21 is dry-etched with the patterned photoresist film 20 used as a mask. Thereafter, the photoresist film 20b is removed, and then, the substrate 18 is washed. Thus, there is formed the patterned amorphous silicon film 21 constituting a major part of TFT. The thus amorphous silicon film 21 corresponds to the amorphous silicon pattern 6 illustrated in FIG. 4.

Figure 7G:
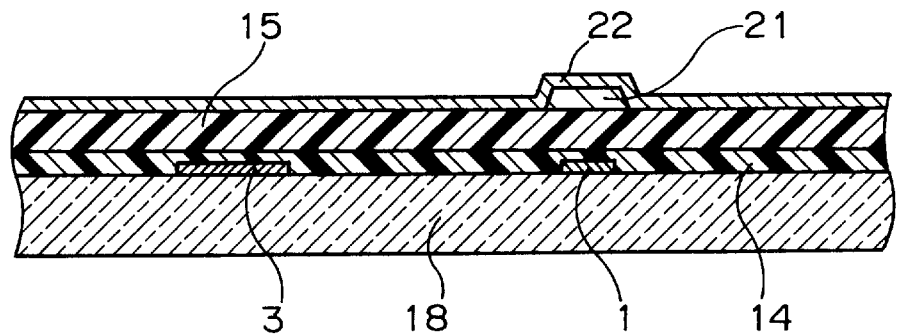

Then, as illustrated in FIG. 7G, an upper metal layer 22 is deposited entirely over the product by sputtering.

Figure 7H:
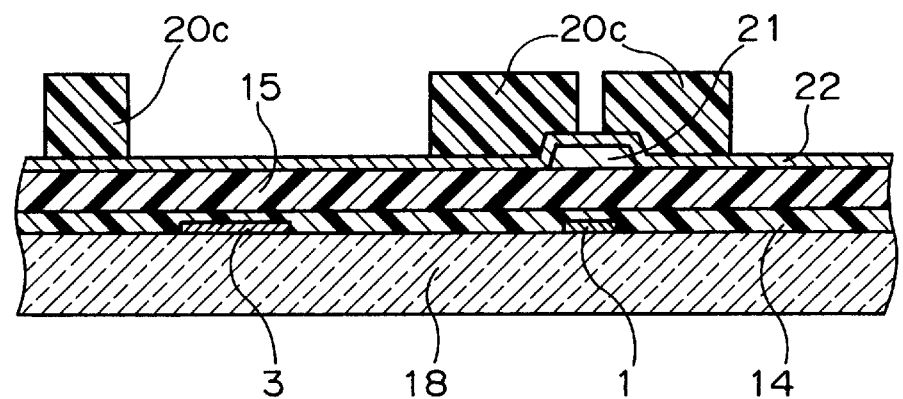

Then, as illustrated in FIG. 7H, there is formed a patterned photoresist film 20c on the upper metal layer 22 by a third photolithography step.

Figure 7I:
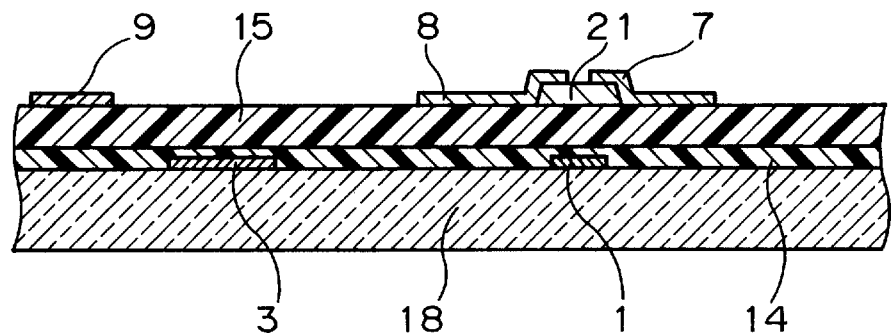

Then, as illustrated in FIG. 7I, the upper metal layer 22 is dry-etched using chlorine family gas with the patterned photoresist film 20c used as a mask. Thereafter, the photoresist film 20c is removed, and then, the glass substrate 18 is washed. Thus, there are formed the source electrode 7, the drain bus line 8, and the drain line terminal 9 on the silicon nitride film 15.

As illustrated in FIG. 7I, the drain bus line 8 and the source electrode 7 are spaced away from each other on an upper surface of the amorphous silicon film 21. Then, the amorphous silicon film 21 is etched with the drain bus line 8 and the source electrode 7 both used as a mask. Thus, there is formed TFT on the glass substrate 18.

Figure 7J:
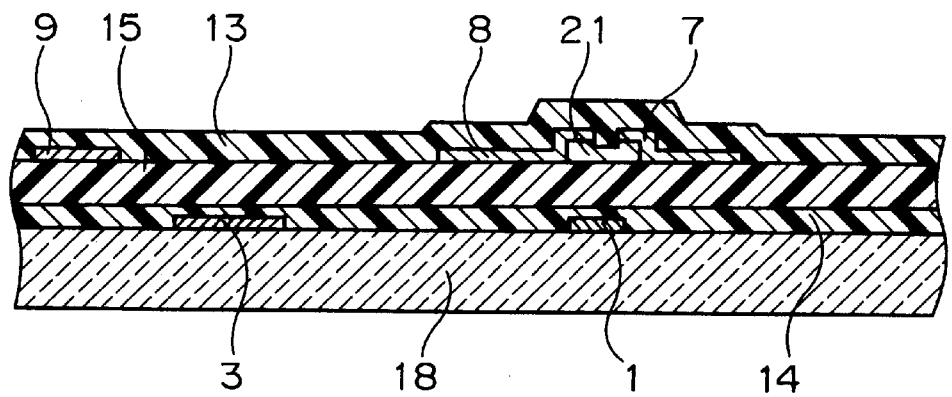

Then, as illustrated in FIG. 7J, a protection film 13 made of silicon nitride is deposited entirely over the product by plasma-enhanced CVD.

Figure 7K:
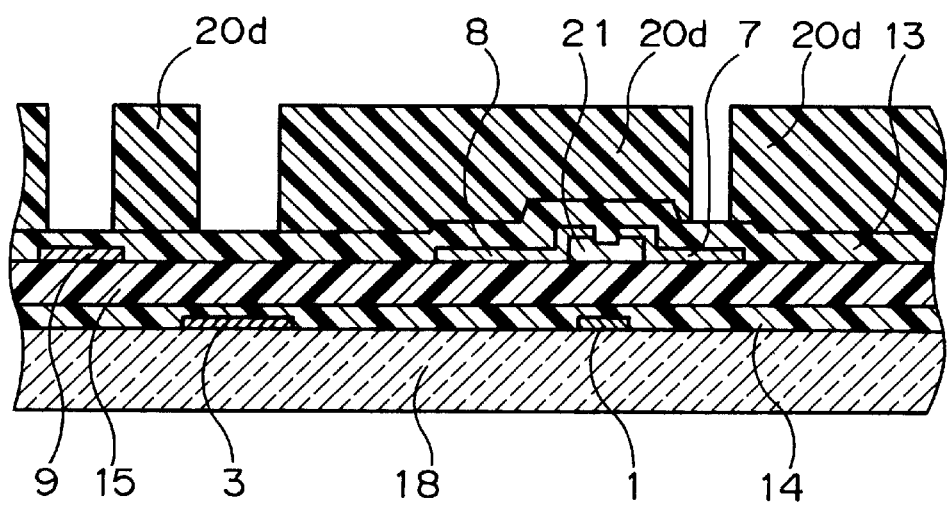

Then, as illustrated in FIG. 7K, there is formed a patterned photoresist film 20d on the product by a fourth photolithography step. The patterned photoresist film 20d will serve as a mask for forming the through-holes 10a, 10b and 10c above both the gate line terminal 3 and the auxiliary capacitive terminal 5, the source electrode 7, and the drain line terminal 9, respectively.

Figure 7L:
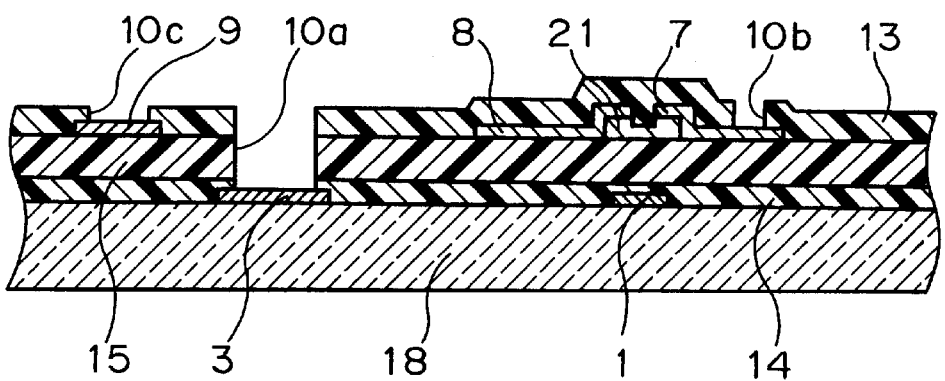

Then, as illustrated in FIG. 7L, the product is wet-etched using buffered hydrofluoric acid (BHF) as an etchant with the patterned photoresist film 20d used as a mask.

Since the upper metal layer 22 serves as an etching stopper, only the protection film 13 is etched, and the silicon nitride film 15 and the silicon dioxide film 14 are not etched above the source electrode 7 and the drain line terminal 9. Since there is not formed the upper metal layer 22, which serves as an etching stopper, above the gate line terminal 3 and the auxiliary capacitive terminal 5, the silicon nitride film 15 is etched.

The silicon nitride film 15 has a smaller etching rate than that of the protection film 13, and hence serves as an etching stopper, resulting in that the silicon nitride film 15 is not removed in its entirety. Hence, the silicon nitride film 15 and the silicon dioxide film 14 are dry-etched for removal with the patterned photoresist film 20d used again as a mask. In the dry-etching, since the upper metal layer 22 serves as an etching stopper, the silicon nitride film 15 is not etched below the source electrode 7 and the drain line terminal 9.

Thus, by the above-mentioned wet-etching and subsequent dry-etching, the silicon dioxide film 14, the silicon nitride film 15 and the protection film 13 are removed above the gate line terminal 3, and as a result there is formed the through-hole 10a above the gate line terminal 3. By the above-mentioned wet-etching, the protection film 13 is removed above the source electrode 7 and the drain line terminal 9, and as a result, there are formed the through-holes 10b and 10c, respectively.

Then, the patterned photoresist film 20d is removed, and then the glass substrate 18 is washed. Thus, there is formed a product as illustrated in FIG. 7L.

Figure 7M:
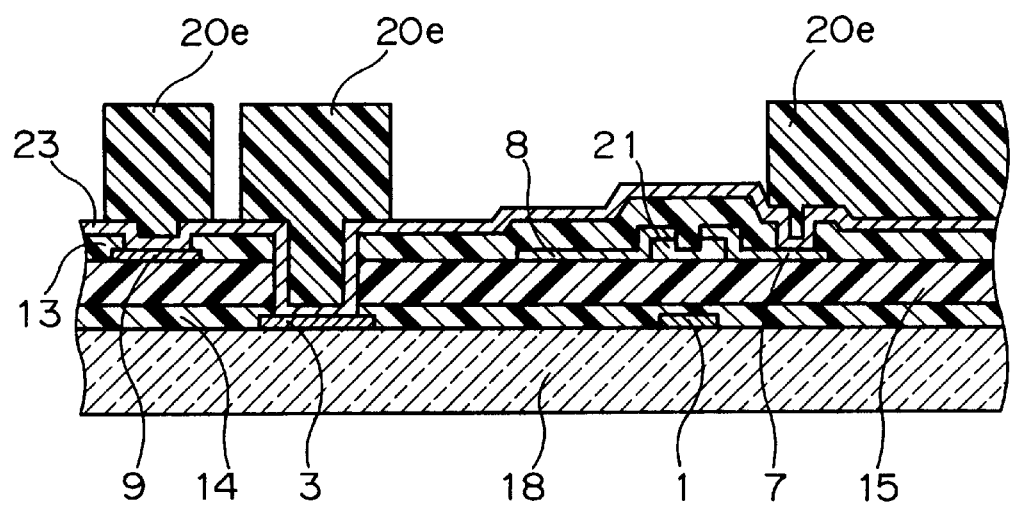
Figure 7N:
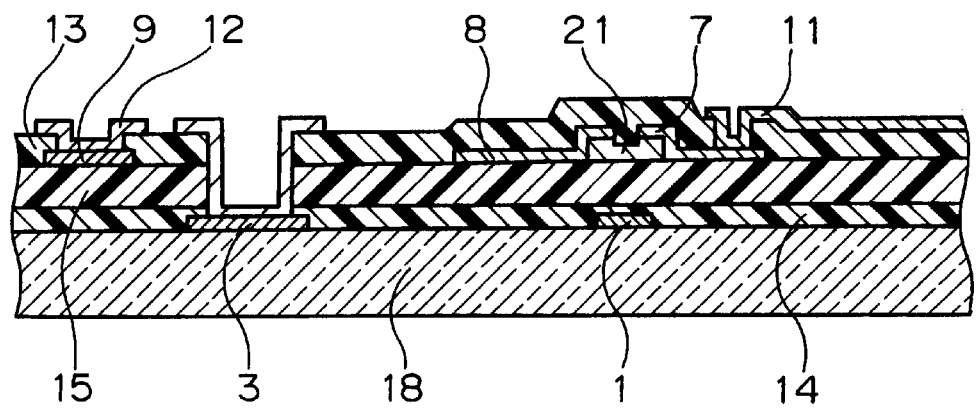

Then, as illustrated in FIG. 7M, a film made 23 of indium tin oxide (ITO) is deposited entirely over the product by sputtering. Subsequently, a patterned photoresist film 20e is formed on the ITO film 23 by a fifth photolithography.

Then, the ITO film 23 is wet-etched with the patterned photoresist film 20e used as a mask. Thereafter, the photoresist film 20e is removed, and then, the product is washed. Thus, there are formed the pixel electrode 11 covering an inner wall of the through-hole 10b therewith, and the transparent electrodes 12 covering inner walls of the through-holes 10a and 10c, as illustrated in FIG. 7N. Thus, the TFT array in accordance with the first embodiment is completed on the glass substrate 18.

It was necessary to carry out six photolithography steps in order to fabricate the conventional TFT. In contrast, in accordance with the above-mentioned first embodiment, TFT may be completed by carrying out only five photolithography steps, which is smaller in the number of photolithography steps than the conventional method by one.

Second Embodiment

Figure 8:
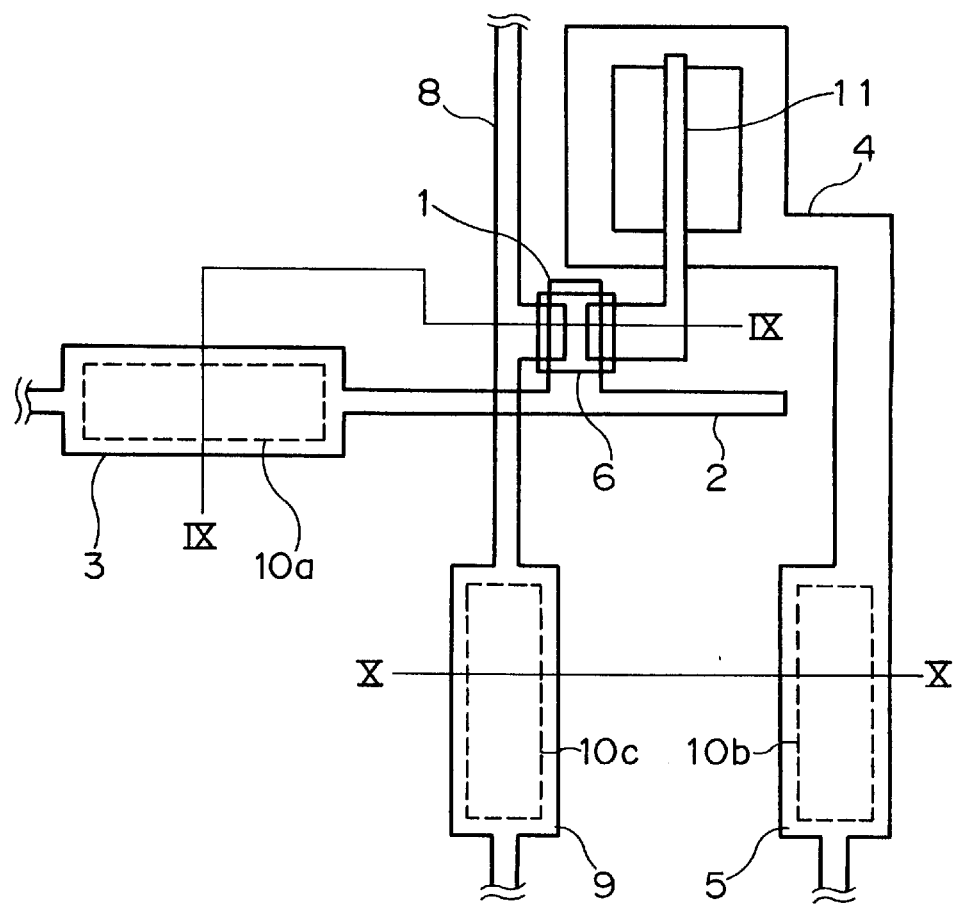
FIG. 8 is plan view illustrating a thin film transistor array in accordance with the second embodiment of the invention.

The second embodiment in accordance with the present invention is explained hereinbelow with reference to FIGS. 8, 9, 10 and 11A to 11L. A thin film transistor array in accordance with the second embodiment is an array driving liquid crystal by applying a horizontal electric field to a transparent, insulating substrate thereto. FIG. 8 is a plan view illustrating TFT, FIG. 9 is a cross-sectional view taken along the line IX—IX in FIG. 8, illustrating a gate line and TFT, FIG. 10 is a cross-sectional view taken along the line X—X in FIG. 8, illustrating a drain line terminal and an auxiliary capacitive terminal, and FIGS. 11A to 11L illustrate respective steps of a method of fabricating a TFT array in accordance with the second embodiment.

Figure 9:
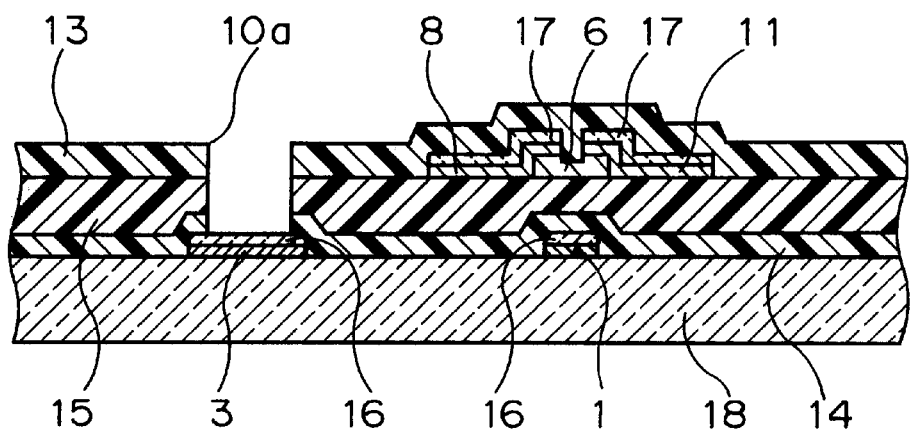
FIG. 9 is a cross-sectional view taken along the line IX—IX in FIG. 8.
Figure 10:
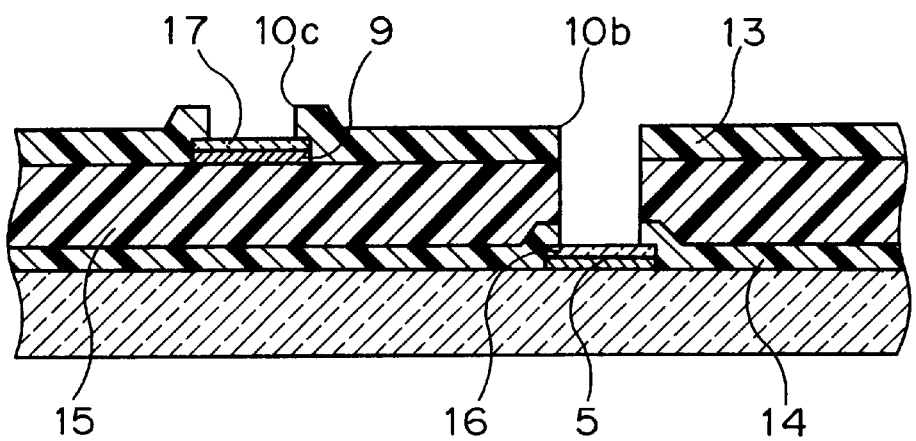
FIG. 10 is a cross-sectional view taken along the line X—X in FIG. 8.

As illustrated in FIGS. 8 and 9, a TFT array in accordance with the second embodiment includes a transparent insulating substrate 18, a plurality of TFTs formed on the substrate 18 in a matrix, a gate bus line 2 connected to gate electrodes of TFTs, a drain bus line 8 connected to drain electrodes of TFTs, and a comb-shaped pixel electrode 11 driven by TFTs.

As illustrated in FIG. 9, each of TFTs is comprised of a gate electrode 1, a lower transparent metal layer 16 formed on the gate electrode 1, a gate insulating film 14 covering the substrate 18 therewith, a silicon nitride film 15 deposited on the gate insulating film 14, an operative semiconductor film 6 formed on the silicon nitride film 15, a drain bus line 8 formed on the silicon nitride film 15 and partially on the operative semiconductor film 6, and an upper transparent metal layer 17 formed on the drain bus line 8. The pixel electrode 11 is formed on the silicon nitride film 15 and partially on the operative semiconductor film 6 of TFT. The upper transparent metal layer 17 is also formed on the pixel electrode 11.

The TFT array further includes an auxiliary capacitive bus line 4 in facing relation with the pixel electrode 11 with the gate insulating film 14 therebetween. The TFTs formed on the substrate 18 are covered with a protection film 13.

As illustrated in FIGS. 9 and 10, a gate line terminal 3 and an auxiliary capacitive terminal 5 are formed on the substrate 18, above both of which there are formed through-holes 10a and 10b throughout the protection film 13, the silicon nitride film 15 and the gate insulating film 14. The lower transparent metal layers 16 are formed on the gate line terminal 3 and the auxiliary capacitive terminal 5. A drain line terminal 9 is formed on the silicon nitride film 15, and is covered thereon with the upper transparent metal layer 17. There is formed a through-hole 10c throughout the protection film 13 above the drain line terminal 9.

The thin film transistor array in accordance with the second embodiment includes facing electrodes which are not formed on facing substrates, but in a TFT substrate. The thin film transistor array in accordance with the second embodiment is of an in-plane type where liquid crystal is controlled by electric field produced between the facing electrodes in parallel with a substrate. Since TFT utilizes a horizontal field to be produced between the auxiliary capacitive bus line 4 and the pixel electrode 11, it is not necessary for TFT in accordance with the second embodiment to have the transparent electrode 12 unlike TN type TFT in accordance with the first embodiment.

Figure 11A:
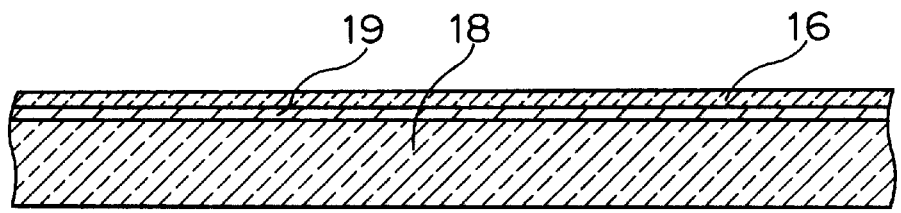
FIGS. 11A to 11L are cross-sectional views of a thin film transistor array formed on a substrate, illustrating respective steps of a method of forming the same in accordance with the second embodiment.

The method of fabricating the TFT array illustrated in FIGS. 8 to 10 is explained hereinbelow with reference to FIGS. 11A to 11L. First, a transparent, insulating substrate 18 such as a glass substrate is washed at a principal surface thereof. Then, as illustrated in FIG. 11A, a lower metal layer 19 is formed on the glass substrate 18 by sputtering. For instance, the lower metal layer 19 is made of Cr, Mo, Al, Ta or Ti. Then, the lower transparent metal layer 16 is deposited entirely over the lower metal layer 19.

Figure 11B:
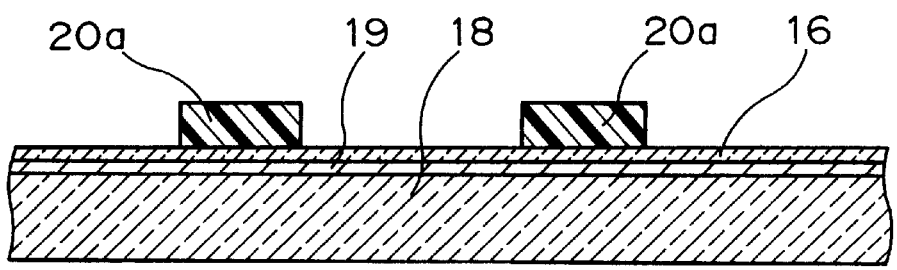

Then, as illustrated in FIG. 11B, a patterned photoresist film 20a which will serve as an etching mask is formed on the lower transparent metal layer 16 by a first photolithography step including application of photoresist onto the lower transparent metal layer 16, exposure of the photoresist to a light, and development of the photoresist film.

Figure 11C:
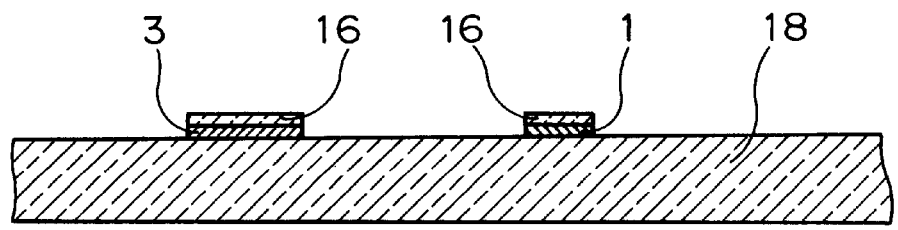

Then, both the lower transparent metal layer 16 and the lower metal layer 19 are wet-etched with the patterned photoresist film 20a serving as a mask. Thereafter, the photoresist film 20a is removed, and then, the glass substrate 18 is washed. Thus, as illustrated in FIG. 11C, there are formed the gate electrode 1 and the gate line terminal 3 of TFT both of which are made from the lower metal layer 19. The gate electrode 1 and the gate terminal 3 are covered at an upper surface thereof with the lower transparent metal layer 16. Though not illustrated in FIG. 11C, the gate bus line 2, the auxiliary bus line 4 and the auxiliary capacitive terminal 5 are also formed on the glass substrate 18.

Figure 11D:
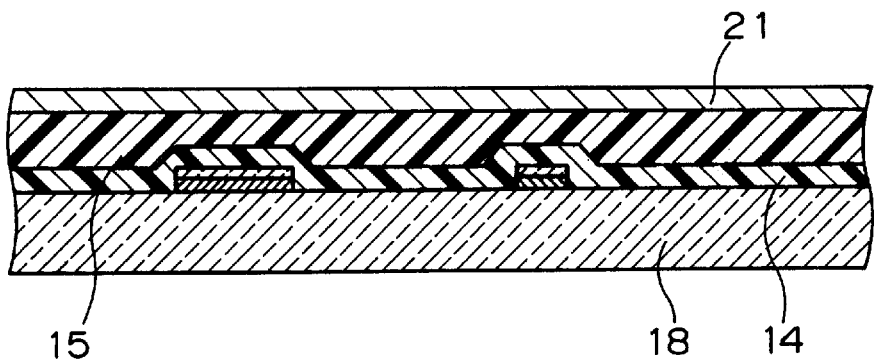

Then, as illustrated in FIG. 11D, the silicon dioxide film 14 are deposited entirely over the glass substrate 18 by sputtering, and then, the silicon nitride film 15 and an amorphous silicon (a-Si+n$^+$a-Si) film 21 are successively formed on the silicon dioxide film 14 by plasma-enhanced CVD.

Figure 11E:
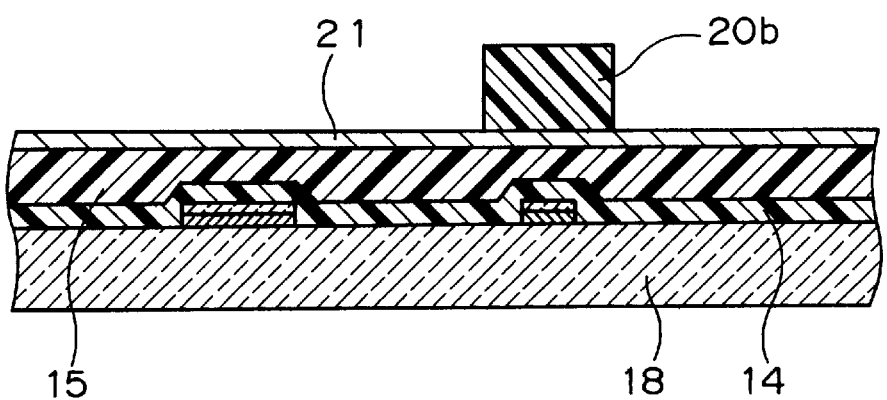

Then, as illustrated in FIG. 11E, there is formed a patterned photoresist film 20b on the amorphous silicon film 21 by a second photolithography step. The patterned photoresist film 20b serves as a mask used for forming an operative device of TFT.

Figure 11F:
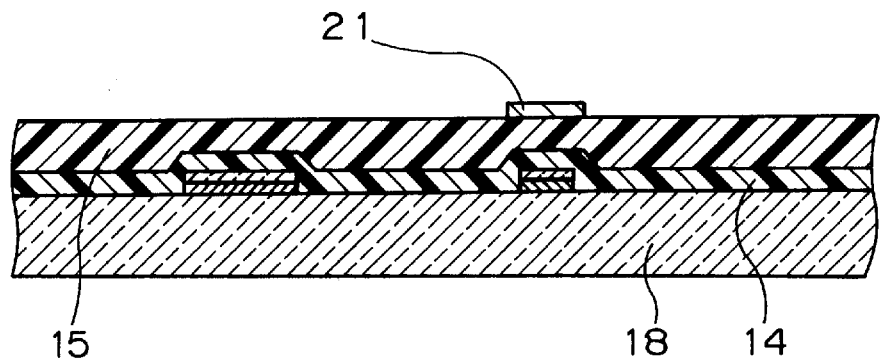

Then, as illustrated in FIG. 11F, the amorphous silicon film 21 is dry-etched with the patterned photoresist film 20b used as a mask. Thereafter, the photoresist film 20b is removed, and then, the substrate 18 is washed. Thus, there is formed the patterned amorphous silicon film 21 constituting a major part of TFT. The thus amorphous silicon film 21 corresponds to the amorphous silicon pattern 6 illustrated in FIG. 8.

Figure 11G:
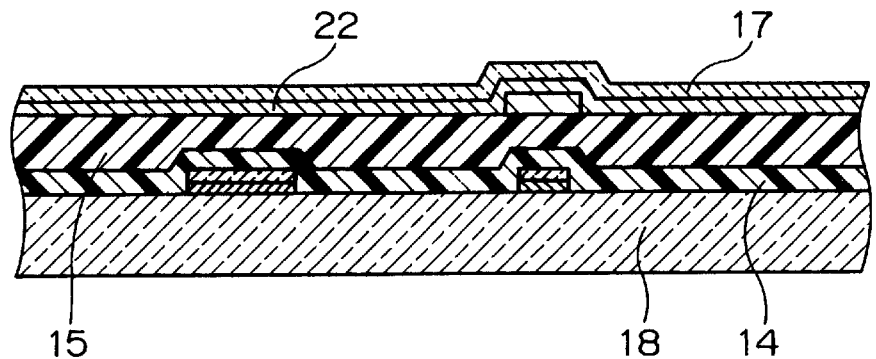

Then, as illustrated in FIG. 11G, an upper metal layer 22 and the upper transparent metal layer 17 are successively deposited entirely over the product by sputtering.

Figure 11H:
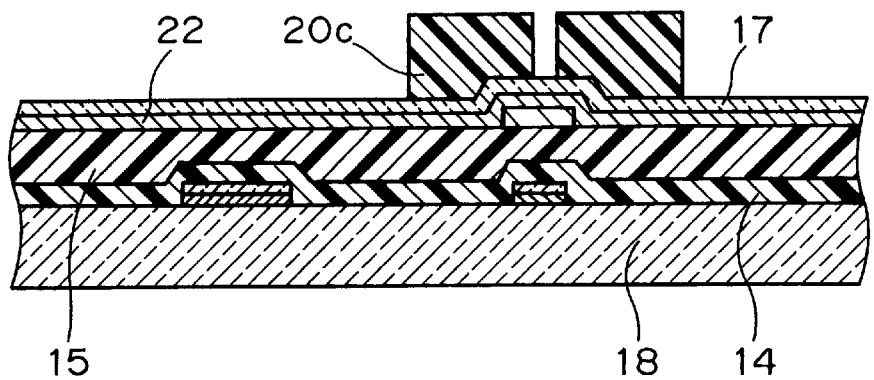

Then, as illustrated in FIG. 11H, there is formed a patterned photoresist film 20c on the upper transparent metal layer 17 by a third photolithography step.

Figure 11I:
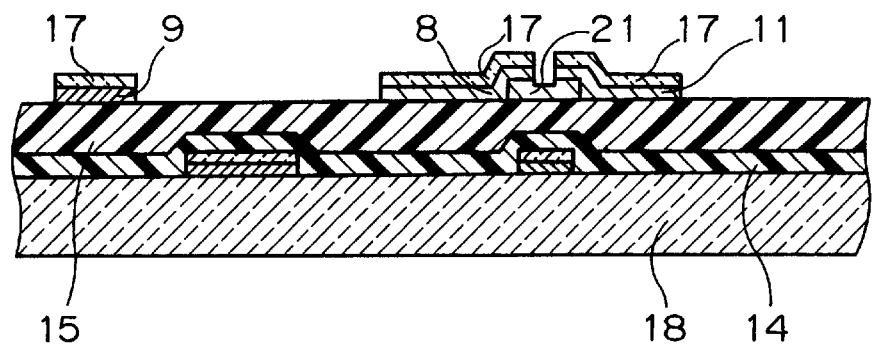

Then, as illustrated in FIG. 11I, both the upper transparent metal layer 17 and the upper metal layer 22 are dry-etched using chlorine family gas with the patterned photoresist film 20c used as a mask. Thereafter, the photoresist film 20c is removed, and then, the glass substrate 18 is washed. Thus, there are formed the drain bus line 8, the pixel electrode 11, and the drain line terminal 9 on the silicon nitride film 15.

As illustrated in FIG. 11I, the drain bus line 8 and the pixel electrode 11 are spaced away from each other on an upper surface of the amorphous silicon film 21. Then, the amorphous silicon film 21 is etched with the drain bus line 8 and the pixel electrode 11 both used as a mask. Thus, there is formed TFT on the glass substrate 18.

Figure 11J:
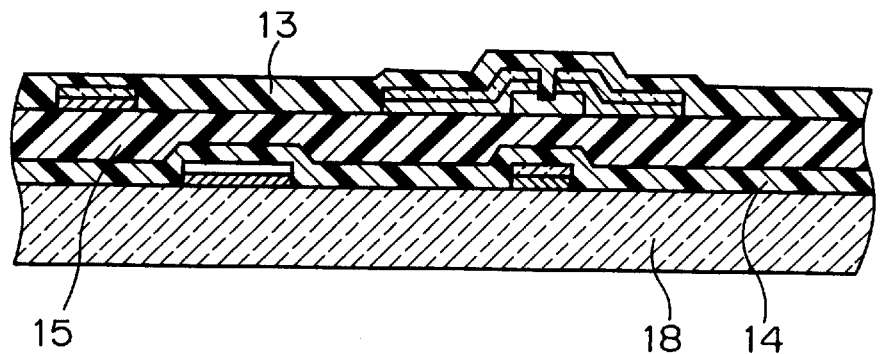

Then, as illustrated in FIG. 11J, a protection film 13 made of silicon nitride is deposited entirely over the product by plasma-enhanced CVD.

Figure 11K:
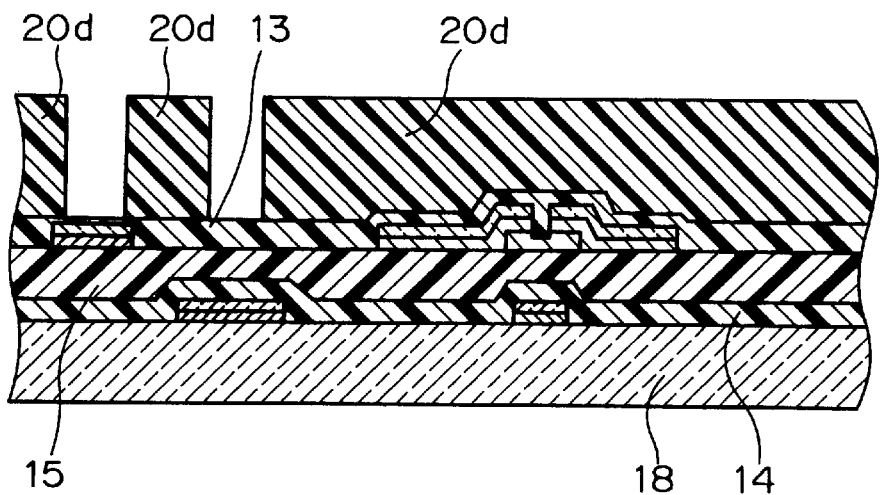

Then, as illustrated in FIG. 11K, there is formed a patterned photoresist film 20d on the product by a fourth photolithography step. The patterned photoresist film 20d will serve as a mask for forming the through-holes 10a, 10b and 10c above the gate line terminal 3, the auxiliary capacitive terminal 5 of the auxiliary capacitive bus line 4, and the drain line terminal 9, respectively.

Figure 11L:
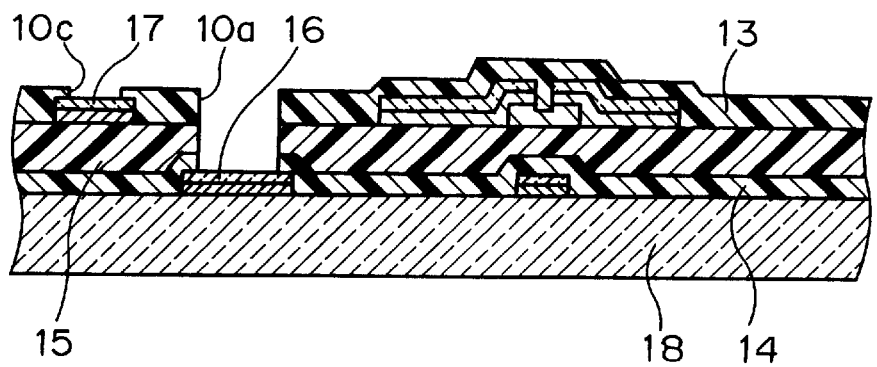

Then, as illustrated in FIG. 11L, the product is wet-etched using buffered hydrofluoric acid (BHF) as an etchant with the patterned photoresist film 20d used as a mask.

Since the upper transparent metal layer 17 serves as an etching stopper, only the protection film 13 is etched, and the silicon nitride film 15 and the silicon dioxide film 14 are not etched below the drain line terminal 9. Since there is not formed the upper transparent metal layer 17, which serves as an etching stopper, above the gate line terminal 3 and the auxiliary capacitive terminal 5, the silicon nitride film 15 is etched.

The silicon nitride film 15 has a smaller etching rate than that of the protection film 13, and hence serves as an etching stopper, resulting in that the silicon nitride film 15 is not removed in its entirety. Hence, the silicon nitride film 15 and the silicon dioxide film 14 are dry-etched for removal with the patterned photoresist film 20d used again as a mask. In the dry-etching, since the upper transparent metal layer 17 serves as an etching stopper, the silicon nitride film 15 is not etched below the drain line terminal 9.

Thus, by the above-mentioned wet-etching and subsequent dry-etching, the silicon dioxide film 14, the silicon nitride film 15 and the protection film 13 are removed above the gate line terminal 3, and as a result there are formed the through-hole 10a and 10b above the gate line terminal 3 and the auxiliary capacitive terminal 5, respectively. Similarly, by the above-mentioned wet-etching, the protection film 13 is removed above the drain line terminal 9, and as a result, there is formed the through-hole 10c.

Then, the patterned photoresist film 20d is removed, and then the glass substrate 18 is washed. Thus, there is formed a product as illustrated in FIG. 11L. Thus, the TFT array in accordance with the second embodiment is completed on the glass substrate 18.

In accordance with the above-mentioned second embodiment, the fifth photolithography step to be carried out for forming the transparent electrode 12 as illustrated in FIG. 7M in connection with the first embodiment may be omitted. However, considering reliability in connection between (a) the gate bus line 1, the drain bus line 8 and the auxiliary capacitive terminal 5, and (b) a driver circuit, it is preferable for a connector between them to be made of ITO rather than ordinary material commonly used for a wiring metal layer. The reason is that since conventional arts are designed to use an anisotropic conductive film having been developed for a simple matrix, connection with a transparent electrode made of ITO is given priority.

It was necessary to carry out six photolithography steps in order to fabricate the conventional TFT. In contrast, in accordance with the above-mentioned second embodiment, TFT may be completed by carrying out only four photolithography steps, which is smaller in the number of photolithography steps than the conventional method by two, and further than the method in accordance with the first embodiment by one.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-338375 filed on Dec. 18, 1996 including specification, claims, drawings and summary is incorporated herein by reference in its entirety.

What is claimed is:

1. A method of fabricating a thin film transistor array comprising a transparent insulating substrate, a plurality of thin film transistors formed on said substrate in a matrix, a gate bus line connected to gate electrodes of said thin film transistors, a drain bus line connected to drain electrodes of said thin film transistors, and a pixel electrode driven by said thin film transistors, said method comprising the steps of:

(a) forming said gate electrodes and said gate bus line on said transparent insulating substrate;
   (b) forming a gate insulating film over said substrate;
   (c) forming an operative semiconductor on said gate insulating film;
   (d) forming source electrodes, said drain electrodes, and said drain bus line of said thin film transistors on said gate insulating film and said operative semiconductor;
   (e) forming a protection film over said substrate;
   (f) removing a portion of both said gate insulating film and said protection film, located above a terminal of said gate bus line, and removing a portion of said protection film located above a terminal of said drain bus line; and
   (g) forming said pixel electrode on said substrate.

2. The method as set forth in claim 1, wherein said thin film transistor array further comprising an auxiliary capacitive bus line formed on said substrate in facing relation to said pixel electrode with said gate insulating film therebetween, and wherein a portion of both said gate insulating film and said protection film, located above a terminal of said auxiliary capacitive bus line, is also removed in said step (f).

3. The method as set forth in claim 1, wherein said gate insulating film is formed to have a multi-layered structure in said step (b).

4. The method as set forth in claim 1, wherein said operative semiconductor is formed where said gate bus line overlaps said drain bus line.

5. The method as set forth in claim 1, wherein a portion of said protection film located above said drain and source electrodes is also removed in said step (f).

6. The method as set forth in claim 1, wherein said pixel electrode is formed of indium tin oxide (ITO).

7. A method of fabricating a thin film transistor array comprising a transparent insulating substrate, a plurality of thin film transistors formed on said substrate in a matrix, a gate bus line connected to gate electrodes of said thin film transistors, a drain bus line connected to drain electrodes of said thin film transistors, an auxiliary capacitive bus line, and a pixel electrode driven by said thin film transistors, said thin film transistor array controlling liquid crystal by a horizontal field produced between said pixel electrode and said auxiliary capacitive bus line, said method comprising the steps of:

(a) forming said gate electrodes, said gate bus line, and said auxiliary capacitive bus line on said transparent insulating substrate, and a first transparent electrode on said gate electrode and said auxiliary capacitive bus line;

(b) forming a gate insulating film over said substrate;

(c) forming an operative semiconductor on said gate insulating film;

(d) forming (d-1) said drain electrodes and said drain bus line of said thin film transistors on said gate insulating film and said operative semiconductor, (d-2) said pixel electrode of the same material as material of which said drain electrodes and said drain bus line are formed, and (d-3) a second transparent electrode on said drain electrodes, said drain bus line, and said pixel electrode;

(e) forming a protection film all over said substrate; and (f) removing a portion of said protection film located above a terminal of said drain bus line to cause said second transparent electrode to appear, and also removing a portion of said protection film and said gate insulating film both located above a terminal of said auxiliary bus line to cause said first transparent electrode to appear.

8. The method as set forth in claim 7, wherein a portion of said protection film and said gate insulating film located above a terminal of said gate bus line is also removed in said step (f) to cause said first transparent electrode to appear.

9. The method as set forth in claim 7, wherein said gate insulating film is formed to have a multi-layered structure in said step (b).

10. The method as set forth in claim 7, wherein said operative semiconductor is formed where said gate bus line overlaps said drain bus line.

11. The method as set forth in claim 7, wherein said pixel electrode is formed of indium tin oxide (ITO).

* * * * *